US006968063B2

(12) United States Patent
Boyd

(10) Patent No.: US 6,968,063 B2
(45) Date of Patent: Nov. 22, 2005

(54) DYNAMIC VOLUME ADJUSTMENT IN A SLOT MACHINE

(75) Inventor: Scott Boyd, Las Vegas, NV (US)

(73) Assignee: Acres Gaming Incorporated, Las Vegas, NV (US)

(*) Notice: Subject to any disclaimer, the term of this patent is extended or adjusted under 35 U.S.C. 154(b) by 22 days.

(21) Appl. No.: 10/387,180

(22) Filed: Mar. 11, 2003

(65) Prior Publication Data

US 2004/0179701 A1    Sep. 16, 2004

(51) Int. Cl.[7] ............................................. H03G 3/20
(52) U.S. Cl. ..................... 381/57; 381/107; 435/35; 435/20
(58) Field of Search ................ 38/57, 104, 107, 38/109, 98, 103; 463/35, 16–22; 273/138.1

(56) References Cited

U.S. PATENT DOCUMENTS

| 1,661,135 | A | | 2/1928 | Knight |
| 4,628,526 | A | | 12/1986 | Germer |
| 5,070,527 | A | | 12/1991 | Lyun |
| 5,077,799 | A | * | 12/1991 | Cotton ......................... 381/57 |
| 5,208,866 | A | | 5/1993 | Kato et al. |
| 5,450,494 | A | | 9/1995 | Okubo et al. |
| 5,530,761 | A | | 6/1996 | d'Alayer de Costemore d'Arc |
| 5,666,426 | A | | 9/1997 | Helms |
| 5,778,077 | A | | 7/1998 | Davidson |
| 5,907,823 | A | | 5/1999 | Sjöberg et al. |
| 6,091,826 | A | * | 7/2000 | Laitinen et al. ............... 381/56 |
| 6,360,187 | B1 | * | 3/2002 | Hermann ...................... 381/57 |
| 6,561,908 | B1 | * | 5/2003 | Hoke ........................... 463/35 |
| 6,638,169 | B2 | * | 10/2003 | Wilder et al. ................. 463/35 |
| 6,739,973 | B1 | * | 5/2004 | Lucchesi et al. .............. 463/35 |
| 2003/0114214 | A1 | | 6/2003 | Barahona et al. |
| 2004/0029637 | A1 | * | 2/2004 | Hein et al. .................... 463/35 |

FOREIGN PATENT DOCUMENTS

| EP | 0 552 368 A1 | 7/1993 | |
| EP | 0600164 A1 | 6/1994 | |
| EP | 0 610 570 A1 | 8/1994 | |
| EP | 1 067 682 A3 | 10/2003 | |
| FR | 1517088 | 3/1968 | |
| GB | 2 115 987 A | 9/1983 | |
| GB | 2124048 A | * 2/1984 | ............ H03G 3/20 |
| JP | 4136999 A | 5/1992 | |
| JP | 4167024 A | 6/1992 | |

* cited by examiner

Primary Examiner—Brian T. Pendleton
(74) Attorney, Agent, or Firm—Marger Johnson & McCollom, PC

(57) ABSTRACT

A casino gaming machine includes a speaker structured to produce a game audio output having a volume, an ambient noise level (ambient noise level) detector structured to detect an ambient noise level proximate the gaming machine, and an dynamic volume controller configured to regulate the volume of the game audio output in relation to a detected ambient noise level. The gaming machine can produce a plurality of game audio outputs, wherein the game audio output volumes can be differentially adjusted in relation to a detected ambient noise level. Differential volume adjustment can be on the basis of a parameter, such as sound output class.

15 Claims, 7 Drawing Sheets

DYNAMIC VOLUME ADJUSTMENT IN A SLOT MACHINE

BACKGROUND OF THE INVENTION

The present invention relates to the field of gaming machines, and more specifically to gaming machines capable of producing sounds.

Sound is an important way to communicate information to a player in a casino. Sound can be used to attract a player to a game and to communicate information about how to play it. For a player at the gaming machine, sounds can be used to prompt the player to perform certain tasks, to celebrate winning events, and to announce winning events to nearby players.

One drawback to using sound is sound volume regulation. The ambient noise level in a casino varies greatly throughout the day. At peak times, a casino is quite loud. At off-peak times, however, a casino is relatively quiet.

The dynamic range of the ambient noise level creates a problem for game designers wishing to fully utilize sounds to communicate with players. If a gaming machine's volume is set high enough to be heard in the casino during peak times, it will be unpleasantly loud during non-peak times. The off-peak "hyper-volume" problem is sufficiently disturbing that casino personnel reduce the volume on sound-generating gaming machines. As a result, game designers minimize the use of sounds to avoid losing sound altogether.

Adjusting audio volume level is known in combination with cellular telephones, and for home and automobile stereo systems. In typical scenarios, the ambient noise level varies due to extrinsic noises. There are a myriad of ambient noise sources that such systems must be designed to overcome. These are typically transient, such as passing vehicles, household appliances, and the like.

By contrast, the ambient noise level in a casino or other gaming establishment is relatively constant in the short term. Further, the volume of sounds produced by conventional casino gaming machines cannot be altered by a player. Manual downward volume adjustment by casino personnel during non-peak casino periods is time-consuming, and subsequent adjustment is then required as the casino business again increases.

The invention will become more readily apparent from the following detailed description, which proceeds with reference to the drawings, in which:

DETAILED DESCRIPTION OF PREFERRED EMBODIMENT(S)

The present disclosure provides a system for detecting an ambient noise level adjacent a gaming machine and adjusting the sound output of the gaming machine in relation to the ambient noise level.

Figure 1:
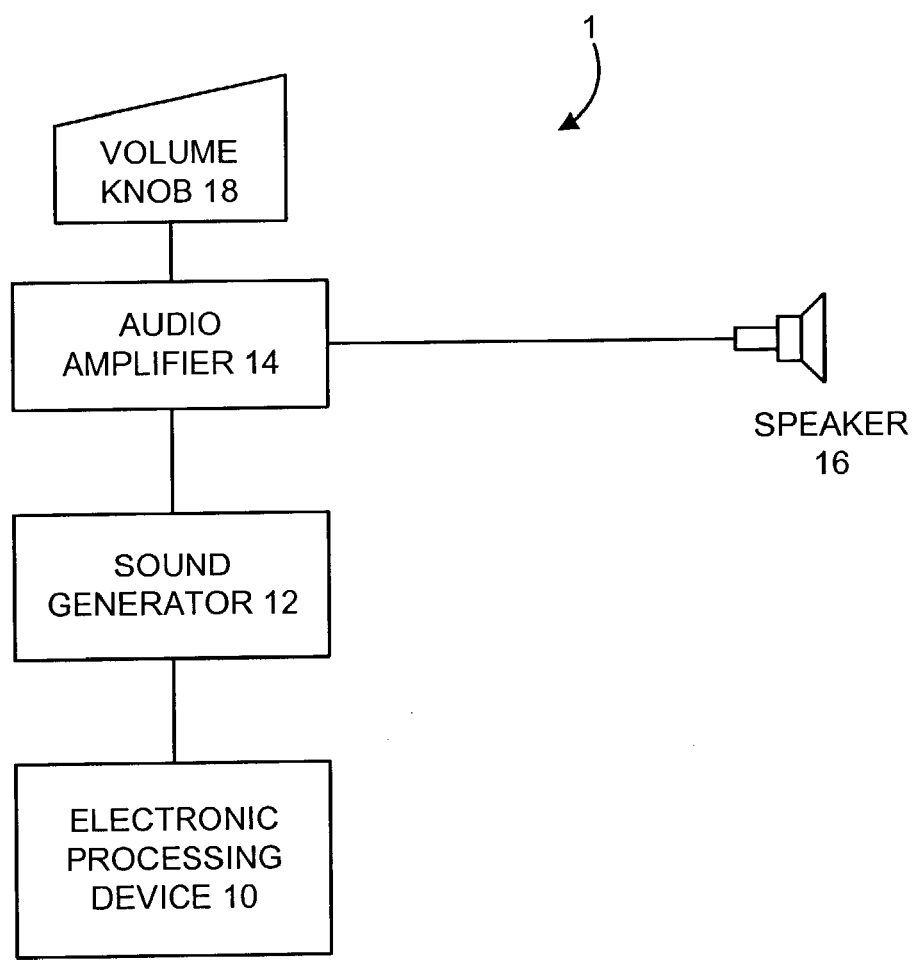
FIG. 1 is a diagram of a gaming machine of the prior art.

Casino gaming machine 1, shown in FIG. 1, generally includes electronic processor 10 programmed to operate a casino game. Sound generator 12 generates a gaming sound pre-amp signal, which is delivered to audio amplifier 14 for amplification and transmission to one or more speakers 16.

Further, these audio outputs have a constant volume for all sounds. Manual volume control 18 can be employed to adjust the sound level of gaming machine 1.

Figure 2:
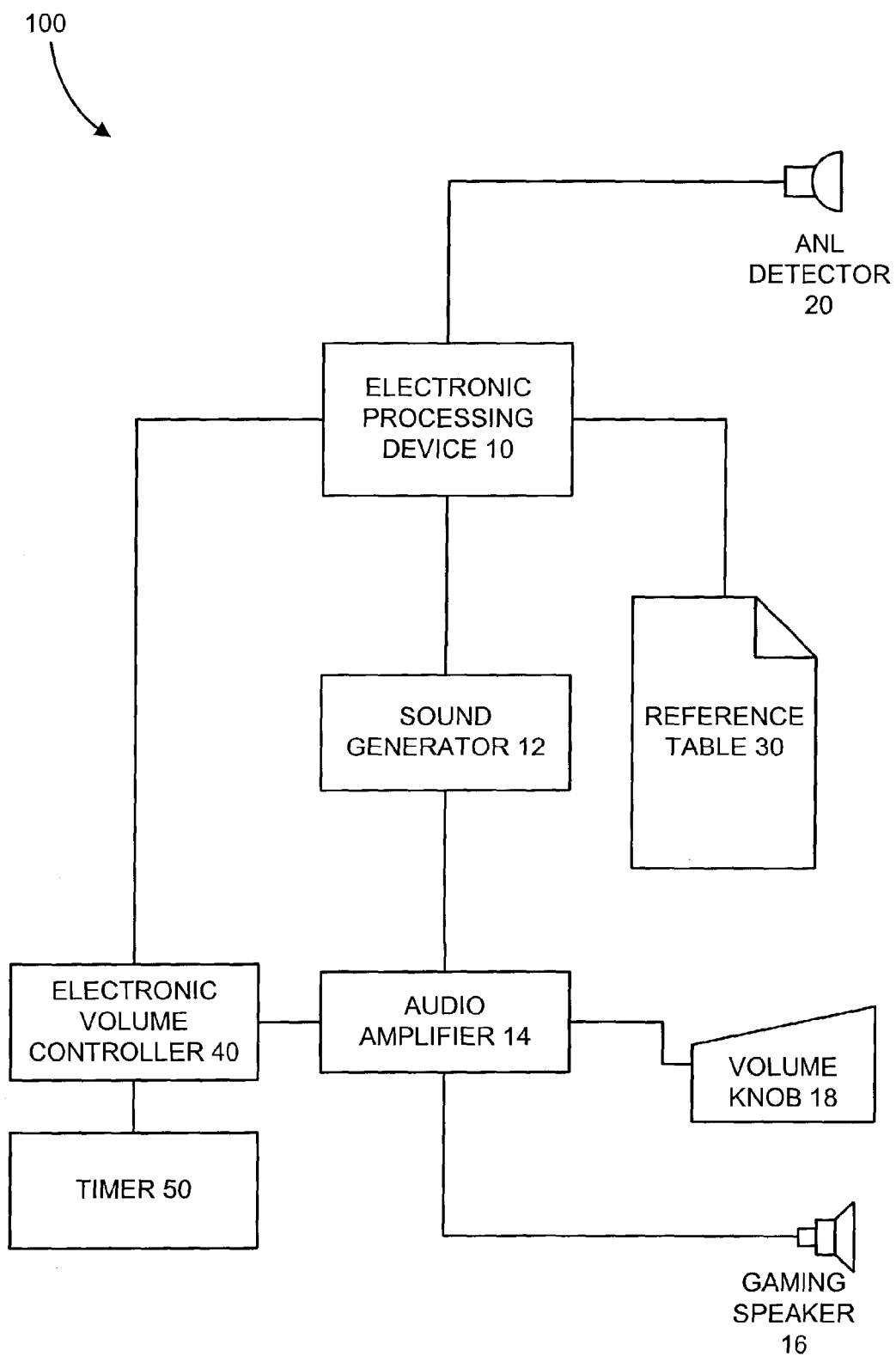
FIG. 2 is a diagram of a casino gaming machine in accordance with the present disclosure, having a volume adjustment system therein.
Figure 5:
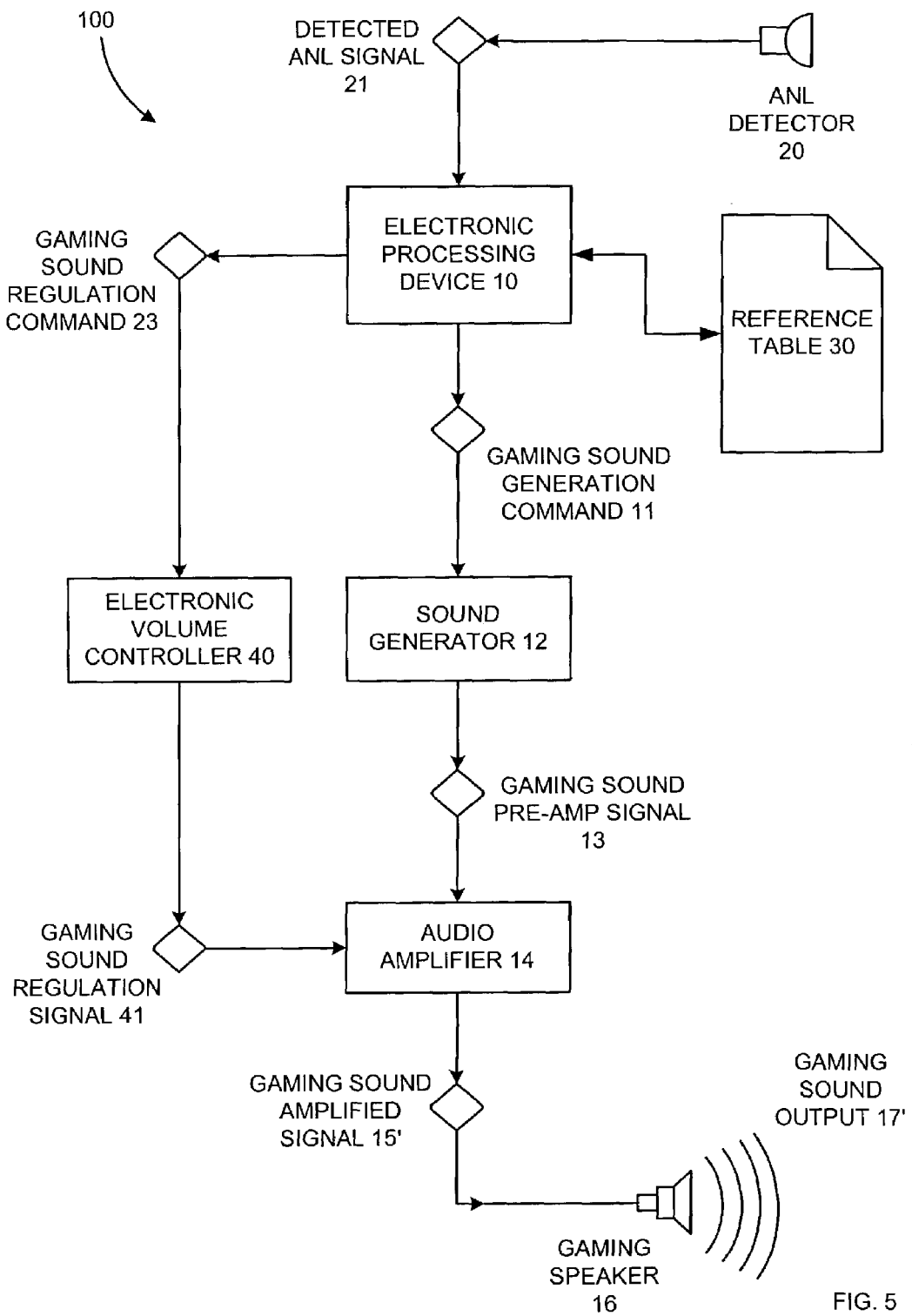
FIG. 5 is a diagram of the embodiment of FIG. 2, showing the flow of signals.
Figure 6:
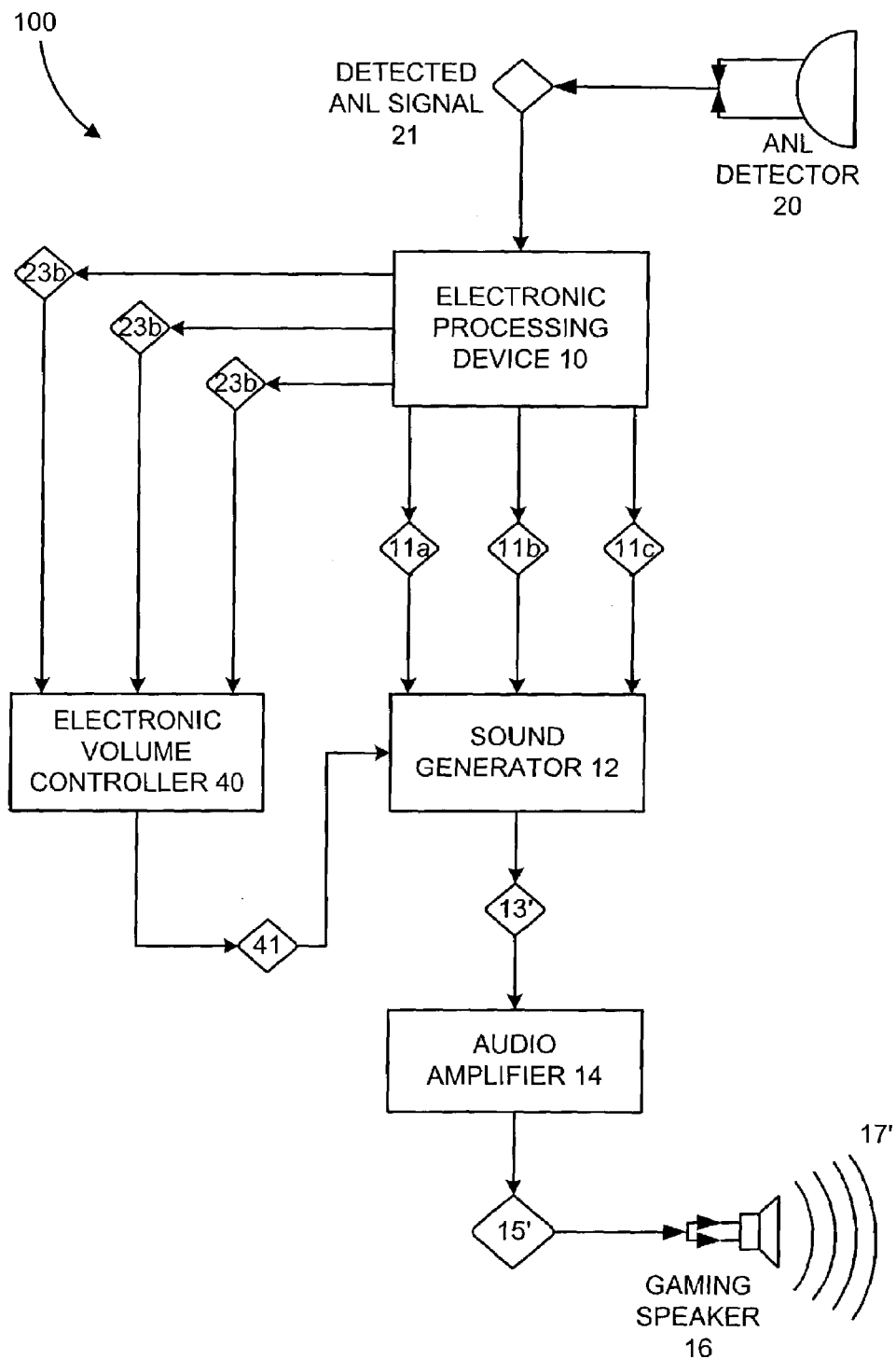
FIG. 6 is a diagram of a fourth embodiment of the gaming machine.

Turning to FIG. 2, a gaming machine 100 in accordance with the present disclosure includes electronic processor 10 structured to operate a casino game. In response to a gaming sound generation command 11, sound generator 12 is structured to produce a gaming sound pre-amp signal 13 for communication audio amplifier 14. Audio amplifier 14 generates a corresponding gaming sound amplified signal 15 having an amplification level. The gaming sound amplified signal 15 is received by speaker 16 and emitted as a gaming sound output 17 (FIG. 5) audible to a player or passerby.

Ambient noise level detector 20 is structured to detect an ambient noise level near gaming machine 100. Ambient noise level detector 20 can be a microphone or other device that detects a sound level. The sensitivity of ambient noise level detector 20 can be set, allowing an operator to detect an ambient noise level of a definable space (or environment) adjacent gaming machine 100. For example, ambient noise level detector 20 can be structured to detect an ambient noise level adjacent the player at gaming machine 100. Alternatively, ambient noise level detector 20 can be set to detect an ambient noise level of a defined area around gaming machine 100. The breadth of the detectable ambient noise environment surrounding gaming machine 100 can be programmed into electronic processor 10 or, alternatively, can be defined by a machine operator.

Figure 3:
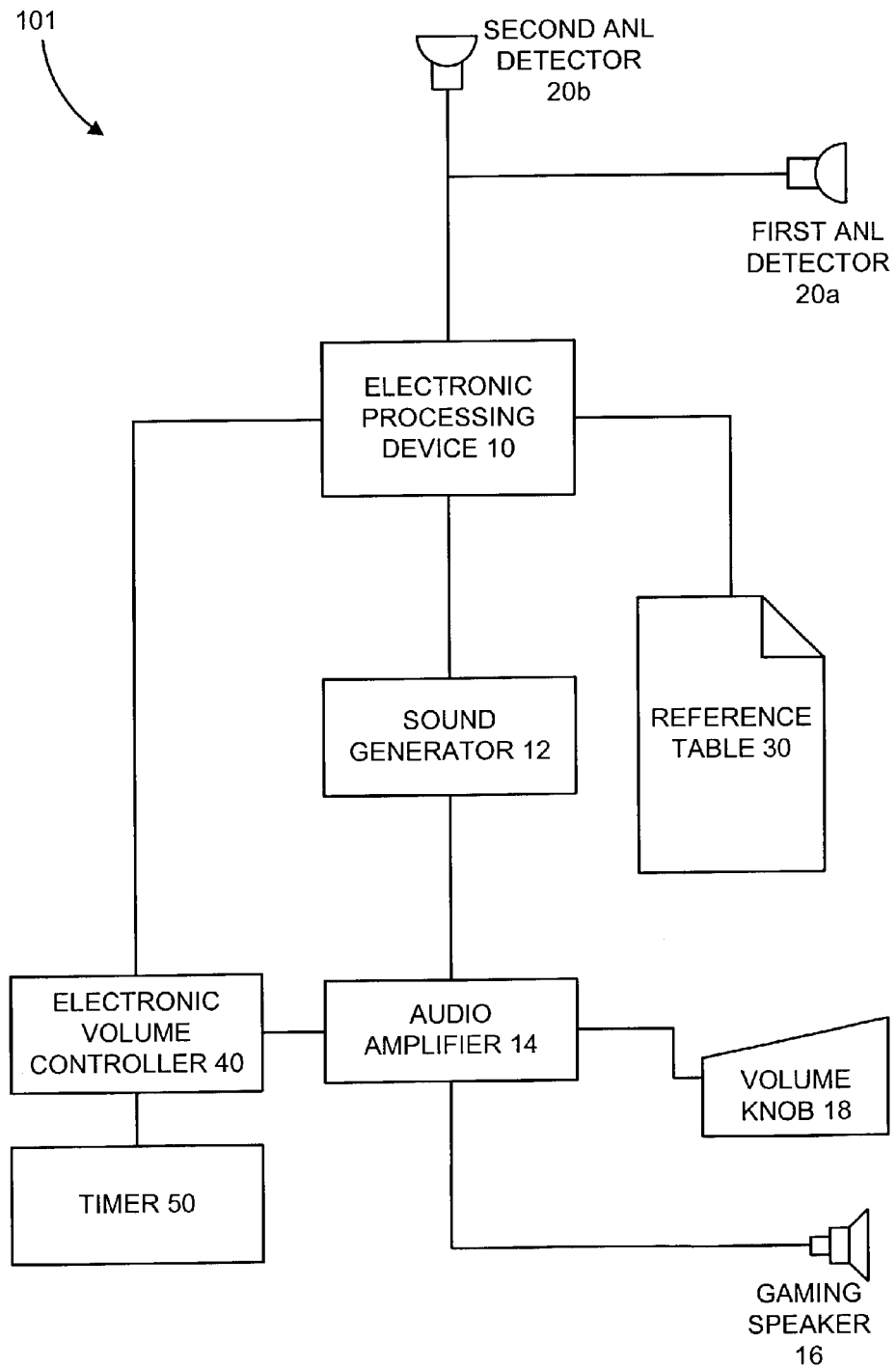
FIG. 3 is a diagram of a second embodiment of the gaming machine having a plurality of ambient noise level detector devices.
Figure 4:
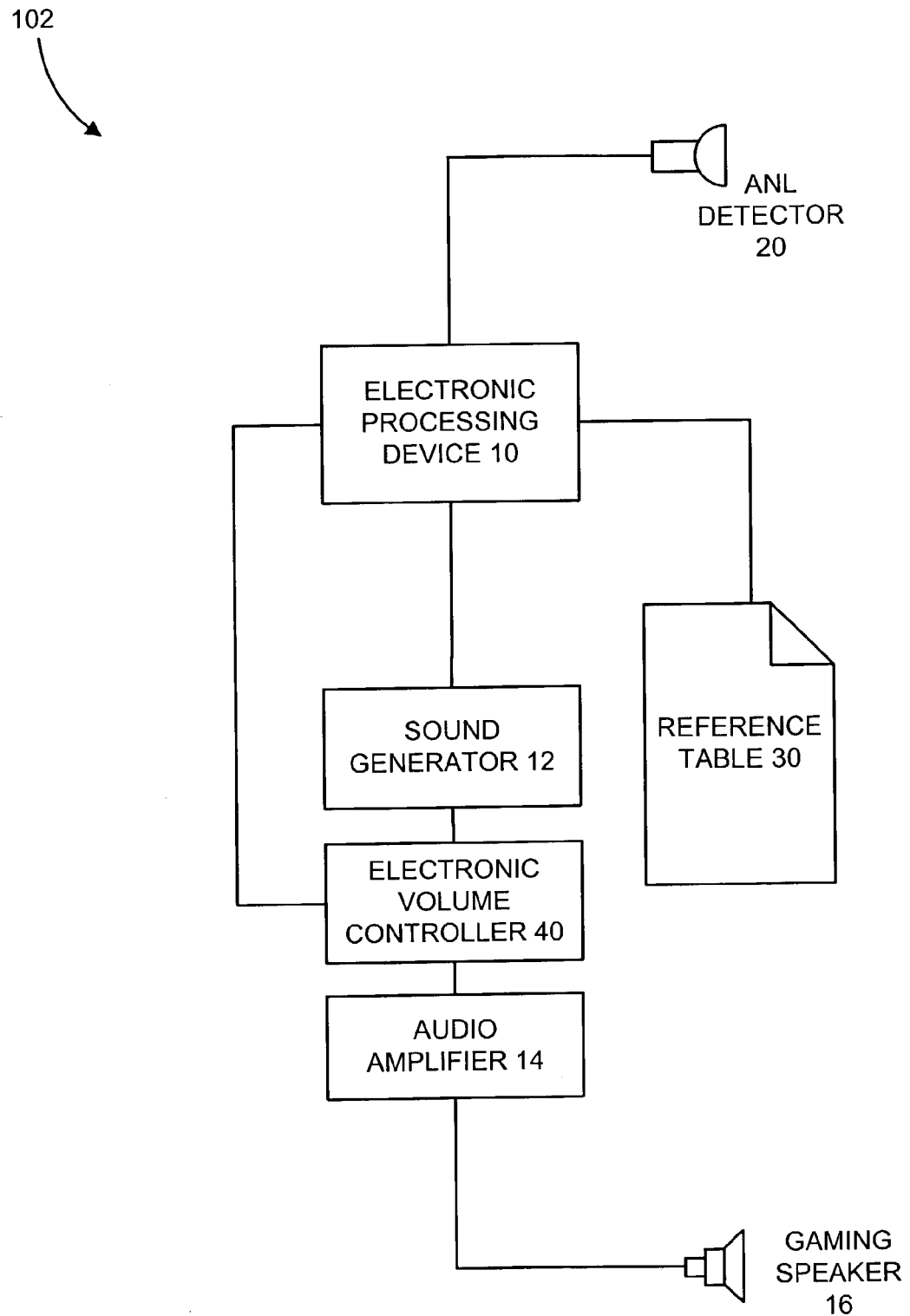
FIG. 4 is a diagram of a third embodiment of the gaming machine.

Ambient noise level detector 20 can include one or more of such sound level measuring devices. As an example, gaming machine 100' (FIG. 3) has a first detector device 20a used to measure, e.g., a local ambient noise level adjacent a user of the gaming machine. A second detector device 20b can measure, in this example, a more global casino-area ambient noise level in the environment of gaming machine 100'.

Returning to FIG. 2, gaming machine 100 further includes electronic volume controller 40 configured to regulate the volume of the gaming sound output in relation to a detected ambient noise level. The present system can adjust the entirety of a given gaming sound output or a portion thereof. In a first example, a relatively high ambient noise level is detected, i.e. The noise level typical of a casino during peak hours. Electronic volume controller 40 can adjust the volume of gaming sound outputs 17 to compensate for the higher background noise level of the casino.

Electronic volume controller 40 can adjust a gaming sound output 17 at a number of stages. In an embodiment having audio amplifier 14 that ordinarily amplifies the gaming sound pre-amp signal 13 to produce a gaming sound amplified signal 15, electronic volume controller 40 (FIG. 5) can cause audio amplifier 14 to produce adjusted gaming sound amplified signal 15', having an amplification level adjusted in relation to the ambient noise level. Volume control can be accomplished through circuitry configured to accept a volume input for a signal 13 and reduce or attenuate the voltage thereof.

Gaming sound pre-amp signal 13 can be an electronic signal, such as a .WAV file, having a volume control register, i.e. a component of the pre-amp signal 13 that specifies a sound loudness. In one embodiment, the volume control register of gaming sound pre-amp signal 13 can be adjusted by electronic volume controller 40.

Figure 7:
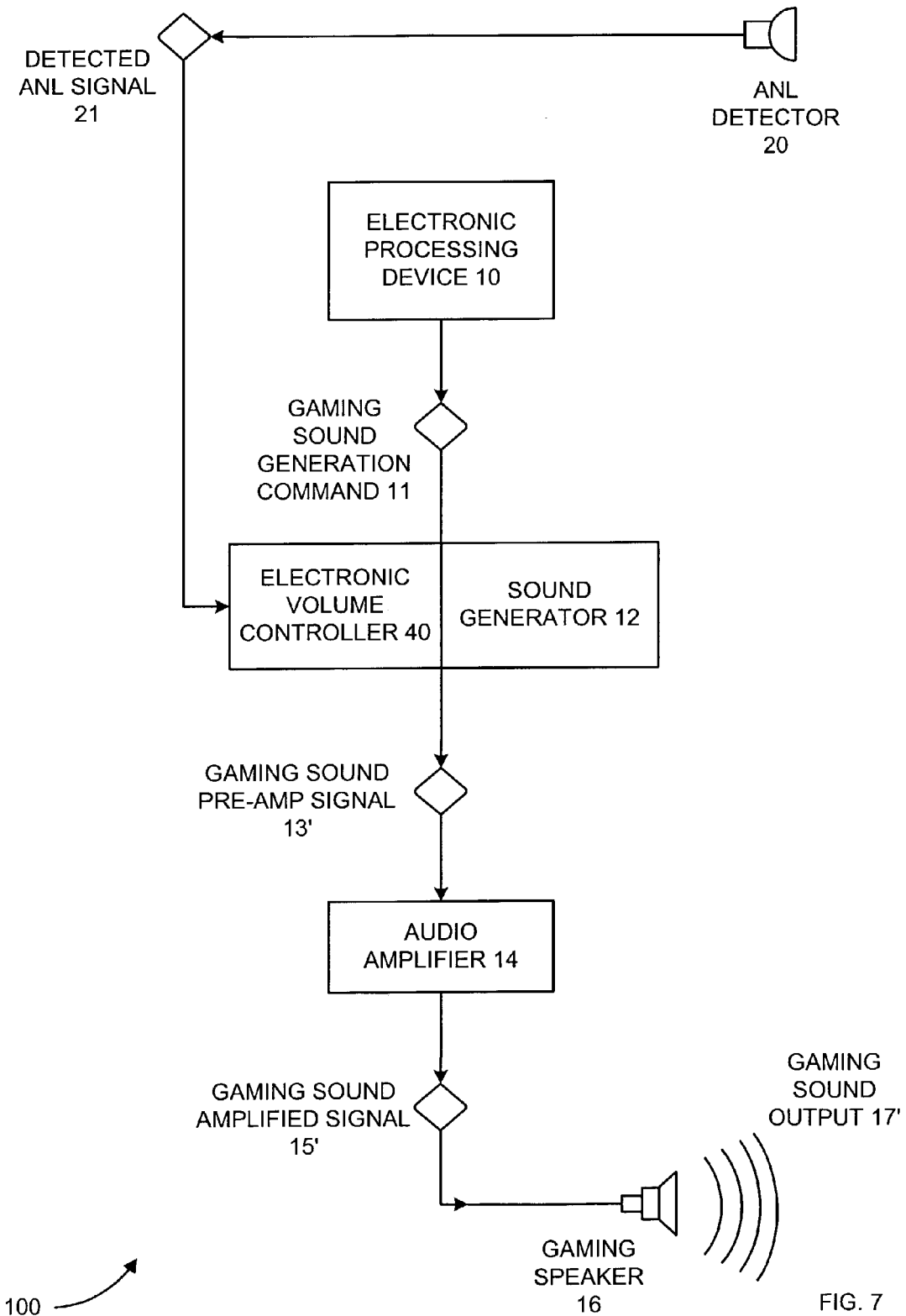
FIG. 7 is a diagram of the embodiment of FIG. 4, showing the flow of signals.

Alternatively, electronic volume controller 40 can adjust gaming sound pre-amp signal 13 (FIG. 7). Gaming sound pre-amp signal 13 can be an electronic signal comprising a plurality of signals 11a–11c corresponding to individual sounds. Electronic processing device 10 issues gaming sound regulation commands 23a–23c in relation to detected ambient noise signal 21. In response to the regulation signals 23-a–23c, electronic volume controller 40 produces gaming sound regulation signal 41, causing sound generator 12 to issue adjusted gaming sound pre-amp signal 13'.

It can be appreciated that, functioning in this capacity, electronic volume controller 40 also can serve as sound generator 12, effectively generating a gaming sound pre-amp signal 13' for transmission to audio amplifier 14. Gaming sound pre-amp signal 13' is amplified by audio amplifier 14 to produce gaming sound amplified signal 15', resulting in gaming sound output 17'.

After an ambient noise level is detected for the vicinity of gaming machine 100, the detected ambient noise level can be compared to values in a reference table of ambient noise level:adjustment values. The volume of the gaming sound pre-amp signal 13 or gaming sound amplified signal 15 is then adjusted in accordance with a value in the reference table to yield an appropriately adjusted gaming sound output.

Alternatively, electronic volume controller 40 can attenuate the voltage of pre-amp signal 13. A voltage corresponding to a maximum loudness is selected as a default voltage for pre-amp signal 13. Electronic volume controller 40 thereby can attenuate the gaming sound output 17 by downwardly adjustment through electronic attenuation of signal 13 voltage.

Sound-producing casino gaming machines generally are structured to produce a plurality of gaming sounds. In gaming machine 100, gaming sounds can be classified into two or more classes. For instance, it sometimes is desired to communicate a game instruction (instruction sound) to a player. These signals can include musical tones, or they can be synthesized or recorded speech.

Modern casino gaming machines, such as a slot machine, are electronic devices. Using a slot machine as an example, the symbol-bearing spinning reels of traditional machines are currently presented by electronic displays. A modern gaming machine therefore typically issues a spinning reel sound (game-play sound), mimicking the sound traditionally produced by older mechanical reels.

Gaming machine 100 also can produce attraction sounds, that is, sounds, music, and other noises to attract a player to that machine or to an adjacent gaming machine.

Sounds issued to celebrate a winning event by a player (winning sounds) typically are desired to be easily heard by the player, and are also preferred to be heard by others in the casino. Winning sounds increase player pleasure, alert others of the player's success, and stimulate others to play a casino gaming machine.

It can be appreciated that sounds, or classes of sounds, can have varying volume regulation profiles. Instruction sounds and game-play sounds are relevant only to the player and need not be heard elsewhere in the casino. Attraction sounds generally are intended only for those persons near gaming machine 100. On the other hand, it is generally preferred that winning sounds be heard by the greatest number of people and not limited to those near gaming machine 100.

Further, it is undesirable to indiscriminately amplify instruction sounds, attraction sounds and game-play sounds and thereby potentially increase the overall ambient noise of the casino.

In one embodiment, electronic volume controller 40 can be configured to differentially regulate the volumes of the plurality of gaming machine sound outputs in relation to a detected ambient noise level. Differential regulation can be by classification of the gaming sound (e.g., winning sound v. Instruction sound) or identity of a particular sound (e.g., a large jackpot winning sound can be upwardly-adjusted more than a small jackpot winning sound).

As has been seen, attraction sounds can be employed whether gaming machine 100 is active or inactive. Casino gaming machine 100 as described herein can further include timer 50 (FIG. 2) operative to measure a game inactive time period. Attraction sounds can be increased in volume after gaming machine 100 has been unplayed for a specified period of time.

Similarly, gaming machine 100 can be structured to adjust gaming sound output volumes when a person is detected at the gaming machine. For example, gaming machine 100 can increase attraction sound volumes to attract a person near but not at the gaming machine. The volume level of such sounds may be suitable for player attraction but overloud for a player at the machine. Upon detecting a player at the machine (e.g., when a player sits at gaming machine 100 or enters a coin, or when a person comes within the vicinity of gaming machine), the gaming machine then can reduce the sound output volume to a level more appropriate for the player.

A conventional manual volume adjustment control 18 can be provided, by which a player or casino personnel can increase or decrease the overall audio volume of the machine. Electronic volume controller 40 can be activated to override a manual volume setting upon the occurrence of a specified event, e.g. Gaming machine 100 being inactive for a specific time period or detection by ambient noise level detector 20 of a significant change in the detected ambient noise level.

Conventional gaming machines can be widely varied, for example having a plurality of speakers 16 for stereophonic sound, a multi-channel audio amplifier and/or one or more single-channel audio amplifiers. It is understood that the present system can be employed with these various sound component configurations.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention.

While the invention has been disclosed in its preferred form, the specific embodiments thereof as disclosed and illustrated herein are not to be considered in a limiting sense. Indeed, it should be readily apparent to those skilled in the art in view of the present description that the invention can be modified in numerous ways. The inventor regards the subject matter of the invention to include all combinations and subcombinations of the various elements, features, functions and/or properties disclosed herein.

What is claimed is:

1. A gaming machine, comprising:
   a speaker structured to produce a plurality of gaming sound outputs of different classes, each of said gaming sound outputs having a volume;
   an ambient noise level detector structured to detect an ambient noise level of a gaming machine vicinity and produce a detected ambient noise level signal; and
   a dynamic volume controller configured to differentially regulate the volumes of the gaming sound outputs in response to a detected ambient noise level signal.

2. The gaming machine of claim 1 wherein the plurality of gaming sound outputs are categorized into a plurality of gaming sound classes; and
   the dynamic volume controller is configured to differentially regulate a volume of a first gaming sound output in relation to the detected ambient noise level on the basis of the gaming sound class to which the first gaming sound output is assigned.

3. The gaming machine of claim 2 wherein the plurality of gaming sound classes includes at least one of attraction sounds, instruction sounds, game-play sounds or winning sounds.

4. The gaming machine of claim 1 wherein the gaming machine vicinity is a definable gaming machine vicinity.

5. The gaining machine of claim 4 wherein the definable gaming machine vicinity is definable by either of a user or a gaming electronic processor.

6. The gaming machine of claim 1 wherein:
   the speaker is structured to produce a plurality of gaming sound outputs, each of said gaining sound outputs having a volume; and
   the dynamic volume controller is configured to regulate the volumes of a sub-plurality of gaining sound outputs in relation to a detected ambient noise level.

7. The gaming machine of claim 1 wherein the dynamic volume controller is operative to upwardly increase the gaming sound output volume if the gaming machine is unplayed for a defined time period.

8. The gaming machine of claim 1 wherein the dynamic volume controller is configured to regulate the volume of the gaming sound output in response to a detected player presence.

9. A gaming device having a dynamic audio output, comprising:
   an audio amplifier structured to generate a first gaming sound amplified signal of a first gaming sound class having a first amplification level; and a second gaming sound amplified signal of a second gaming sound class having a second amplification level;
   a speaker structured to emit a gaming sound output having an output volume, said gaming sound output corresponding to the first gaming sound amplified signal;
   an ambient noise meter configured to measure an ambient noise level of an environment within a gaming machine vicinity; and
   a dynamic volume controller configured to differentially modulate the amplification level of only one of the first gaming sound amplified signal and the second gaming sound amplified signal in relation to the ambient noise level.

10. A gaming device, comprising:
    a sound generator structured to produce plurality of a gaming sound pre-amp signals having a corresponding plurality of input volume components;
    a speaker structured to emit a gaming sound output corresponding to the gaming sound pre-amp signal, said gaming sound output having an output volume corresponding to the input volume component of the gaming sound pre-amp signal;
    an ambient noise detector configured to detect an ambient noise level of an environment within a gaming machine vicinity; and
    a dynamic volume controller configured to regulate the audio output volume in relation to the detected ambient noise level via adjustment of the input volume component;
    wherein the plurality of gaming sound pre-amp signals are categorized into a plurality of game sound classes including at least one of attraction sounds, instruction sounds, game-play sounds and winning sounds; and
    the dynamic volume controller is configured to modulate a sub-plurality of input volume components in relation to the ambient noise level and to differentially modulate an input volume component of a gaming sound pre-amp signal in relation to the ambient noise level on the basis of the gaming sound class to which the gaming sound pre-amp signal is assigned.

11. The gaming device of claim 10 wherein the sound generator is structured to produce a plurality of gaming sound pre-amp signals having a corresponding plurality of volume components; and
    the dynamic volume controller is configured to modulate a sub-plurality of input volume components in relation to the ambient noise level.

12. A method for dynamically controlling a casino gaming machine sound volume, comprising:
    generating a gaming sound pre-amp signal;
    detecting an ambient noise level of an environment proximate the gaming machine;
    comparing the detected ambient noise level to a reference table of ambient noise level values including values for a plurality of game sound classes; and
    adjusting a gaming sound output volume in accordance with a value in the reference table by adjusting a gaming sound output in relation to the detected ambient noise level on the basis of the game sound class to which the first gaming sound output is assigned.

13. The method of claim 12, further comprising:
    measuring a dormant time period of the casino gaming machine;
    comparing the measured dormant time period to a dormant time reference value; and
    adjusting a game audio output volume in accordance with a value in the reference table.

14. A gaming device, comprising:
    a sound generator structured to produce a plurality of gaming sound amplifier signals of different classes having a corresponding plurality of input volume components;
    a speaker structured to emit a gaming sound output corresponding to the gaming sound amplifier signals, said gaming sound output having an output volume corresponding to the input volume component of the gaming sound amplifier signals;
    an ambient noise detector configured to detect an ambient noise level of an environment within a gaming machine vicinity; and
    a dynamic volume controller configured to differentially regulate each of a plurality of the input volume components in relation to the detected ambient noise level via adjustment of the input volume component.

15. A method for dynamically controlling a casino gaming machine sound volume, comprising:
   generating a gaming sound pre-amp signal;
   detecting an ambient noise level of an environment proximate the gaming machine;
   comparing the detected ambient noise level to a reference table of ambient noise level values;
   adjusting a gaming sound output volume in accordance with a value in the reference table;
   measuring a dormant time period of the casino gaming machine;
   comparing the measured dormant time period to a dormant time reference value; and adjusting a game audio output volume in accordance with a value in the reference table.

* * * * *